(12) United States Patent
Hasei et al.

(10) Patent No.: US 7,364,622 B2
(45) Date of Patent: Apr. 29, 2008

(54) METHOD AND APPARATUS FOR FABRICATING A DEVICE, AND THE DEVICE AND AN ELECTRONIC EQUIPMENT

(75) Inventors: Hironori Hasei, Matsumoto (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/382,576

(22) Filed: Mar. 7, 2003

(65) Prior Publication Data
US 2003/0203643 A1 Oct. 30, 2003

(30) Foreign Application Priority Data
Mar. 13, 2002 (JP) ............... 2002-069168
Sep. 4, 2002 (JP) ............... 2002-258810

(51) Int. Cl.
B05B 13/02 (2006.01)
(52) U.S. Cl. ............... 118/321; 118/66; 118/323
(58) Field of Classification Search ........... 118/58, 118/72, 300, 323, 410, 429, 66, 321; 347/102; 219/216; 134/902; 901/43; 29/527.2; 228/260, 228/37, 43; 15/302, 303, 306.1, 309.2
See application file for complete search history.

(56) References Cited

U.S. PATENT DOCUMENTS

| | | | | |
|---|---|---|---|---|
| 3,693,206 A * | 9/1972 | Tatara et al. ............... 15/53.3 |
| 3,710,758 A * | 1/1973 | Hoff ............... 118/63 |
| 3,877,107 A * | 4/1975 | Cirino ............... 15/302 |
| 4,390,564 A * | 6/1983 | Kimble ............... 427/542 |
| 4,972,990 A * | 11/1990 | Abbagnaro et al. ............... 228/20.1 |
| 5,356,066 A * | 10/1994 | Yamada ............... 228/8 |
| 5,467,913 A * | 11/1995 | Namekawa et al. ............... 228/41 |
| 5,500,667 A * | 3/1996 | Schwiebert et al. ............... 347/102 |
| 5,528,271 A * | 6/1996 | Ebisawa ............... 347/34 |
| 5,757,407 A * | 5/1998 | Rezanka ............... 347/102 |
| 5,764,263 A * | 6/1998 | Lin ............... 347/101 |
| 5,772,106 A * | 6/1998 | Ayers et al. ............... 228/254 |
| 5,997,924 A * | 12/1999 | Olander et al. ............... 426/296 |
| 6,063,339 A | 5/2000 | Tisone et al. |
| 6,505,928 B1 * | 1/2003 | Landau et al. ............... 347/102 |
| 6,623,097 B2 | 9/2003 | Okada et al. |
| 6,730,522 B1 | 5/2004 | Nakamura et al. |
| 2002/0039624 A1 * | 4/2002 | Yabe ............... 427/510 |
| 2002/0105688 A1 * | 8/2002 | Katagami et al. ............... 358/505 |
| 2003/0010807 A1 * | 1/2003 | Matthies et al. ............... 228/103 |
| 2003/0047429 A1 * | 3/2003 | Stewart et al. ............... 198/867.01 |
| 2003/0164183 A1 * | 9/2003 | Gingl ............... 134/125 |
| 2004/0191408 A1 | 9/2004 | Okada et al. |
| 2006/0254508 A1 | 11/2006 | Okada et al. |

FOREIGN PATENT DOCUMENTS

CN 1278462 A 1/2001

(Continued)

*Primary Examiner*—Brenda A. Lamb
(74) *Attorney, Agent, or Firm*—Oliff & Berridge, PLC

(57) ABSTRACT

The invention provides an apparatus for fabricating a device, in which a high operation efficiency is maintained in a drying treatment for a multilayer-interconnection device. The device can also be fabricated inexpensively. An apparatus for fabricating a device has an inkjet unit that can dispose a liquid material on a substrate, and a preparatory dryer to blow a gas heated at a predetermined temperature to the substrate.

8 Claims, 12 Drawing Sheets

FOREIGN PATENT DOCUMENTS

| | | |
|---|---|---|
| CN | 1289271 A | 3/2001 |
| CN | 1326425 A | 12/2001 |
| JP | A 62-211919 | 9/1987 |
| JP | A 03-236194 | 10/1991 |
| JP | A 06-313870 | 11/1994 |
| JP | A 06-349721 | 12/1994 |
| JP | A 9-207326 | 8/1997 |
| JP | A 11-158427 | 6/1999 |
| JP | A 11-274671 | 10/1999 |
| JP | A 2000-162779 | 6/2000 |
| JP | A 2000-216330 | 8/2000 |
| JP | A 2001-341296 | 12/2001 |
| JP | A 2002-031800 | 1/2002 |

\* cited by examiner

FIG. 10

METHOD AND APPARATUS FOR FABRICATING A DEVICE, AND THE DEVICE AND AN ELECTRONIC EQUIPMENT

BACKGROUND OF THE INVENTION

1. Field of Invention

The present invention relates to a method and apparatus for fabricating a device having material layers stacked on a substrate. The invention also relates to the device and an electronic equipment.

2. Description of Related Art

In the related art, a photolithography technique can be used as a method for fabricating a device that has a fine wiring pattern, such as a semiconductor integrated circuit. A method for fabricating the device using an inkjet method is disclosed in JP-A-11-274671 and JP-A-2000-216330. The technique disclosed in these documents stacks the material layers on the substrate by discharging a liquid material containing a patterning material from a discharge head on a patterning surface, forms a multilayer-interconnection device, and is advantageous since it is available for a high-mix low-volume production.

In the related art, in fabricating the multilayer-interconnection device, multiple material layers are stacked by alternately disposing the liquid material on the substrate, and preparatorily drying the disposed liquid material using a hotplate or electric oven. Then, a baking treatment is performed for the substrate on which the multiple material layers were stacked, thereby forming the multilayer-interconnection device.

SUMMARY OF THE INVENTION

However, the related art method for fabricating the device is disadvantageous as described below.

In the related art, the process of supplying the liquid material on the substrate employs a unit to supply a material, such as an inkjet unit, where the liquid material is supplied in a condition where the substrate is supported by a stage of the unit. On the other hand, the process of drying the liquid material supplied on the substrate employs a dryer, such as a pot-plate and an electric oven, and the substrate is once removed from the stage of an imaging unit, and then subjected to the drying treatment while being kept in the dryer. Then, the substrate subjected to the drying treatment is conveyed back to the stage of the imaging unit and supported by the stage again, then subjected to the treatment to supply the liquid material.

Thus, it is designed that, in performing each of the treatment of supplying the liquid material and the treatment of drying it, each treatment is performed with the substrate being supported by the different stage. In this case, the substrate must be removed from the stage depending on the treatment, and, for example, the unit to supply the material must be subjected to an alignment treatment with the substrate every time when the substrate is loaded on the stage of the unit to supply the material. In this case, operation efficiency is reduced.

The invention, which addresses these and/or other situations, provides a method and apparatus for fabricating the device where the operation efficiency can be kept high during the drying treatment for the multilayer-interconnection device, and the device can be fabricated at low cost. The invention also provides the device, and the electronic equipment.

To address or solve the above and/or other problems, a method for fabricating the device of the invention includes a deposition process for disposing the liquid material on the substrate, and a preparatory drying process for preparatorily drying the liquid material by blowing gas heated at a predetermined temperature, to the substrate on which the liquid material was disposed. The method for fabricating the device having a process thereby stacks multiple material layers on the substrate.

According to the invention, when the preparatory drying treatment is performed for the liquid material disposed on the substrate, the preparatory drying is performed by blowing the gas, heated at the predetermined temperature, to the substrate on which the liquid material was disposed. Therefore the preparatory drying can be easily performed even if the substrate is not removed from the stage of the unit to dispose the liquid material during the preparatory drying treatment.

Further, the method for fabricating the device of the invention employs a design having a baking process for baking the substrate after each of the deposition process and the preparatory process is repeated a predetermined number of times.

As a result, the multilayer-interconnection device can be fabricated from the multiple material layers that were preparatorily dried and stacked.

In addition, the method for fabricating the device of the invention, in which the liquid material includes a material for forming the device dispersed and disposed in a predetermined solvent, employs a design where the predetermined temperature is set up depending on the solvent.

As a result, the solvent can be eliminated efficiently from the liquid material at an appropriate temperature in the preparatory drying treatment.

In addition, the method for fabricating the device of the invention employs a design where the deposition process is performed using a unit to discharge droplets capable of quantitatively dropping the liquid material.

As a result, a high-mix low-volume production of the device is possible.

In addition, a method for fabricating the device of the invention includes a deposition process for disposing the liquid material on the substrate, and a preparatory drying process for preparatorily drying the liquid material by relatively moving a gas above a surface of the substrate where the liquid material is disposed. The method for fabricating the device thereby stacks multiple material layers on the substrate.

According to the method for fabricating the device, when the preparatory drying treatment is performed for the liquid material disposed on the substrate, the preparatory drying is performed by relatively moving the gas above the surface of the substrate, on which the liquid material was disposed, to the substrate. Therefore the preparatory drying can be easily performed even if the substrate is not removed from the stage of the unit to dispose the liquid material. That is, the gas above the surface of the substrate moves relatively to the substrate, thereby vapor pressure above the surface of the substrate is lowered, and vaporization of the liquid material is accelerated. Moreover, since the substrate is not always required to be heated during the preparatory drying, load due to the heating is reduced on the substrate and material.

In the method for fabricating the device, the preparatory drying may be performed by blowing a predetermined gas to the substrate, or by moving the substrate.

In each case, vaporization of the liquid material is accelerated because the gas above the surface of the substrate moves relatively to the substrate.

An apparatus for fabricating the device of the invention includes a preparatory dryer to blow the gas heated at the predetermined temperature to the substrate, and a deposition unit to supply the liquid material on the substrate.

According to the invention, since the preparatory dryer for preparatorily drying the liquid material formed on the substrate in the deposition unit is designed to blow the gas, heated at the predetermined temperature, to the substrate, the preparatory drying can be easily performed, even if the substrate is not removed from the stage of the unit to dispose the liquid material during the preparatory drying treatment.

In addition, in the apparatus for fabricating the device of the invention, the preparatory dryer employs a design having the stage to support the substrate, a gas supply portion capable of supplying the gas to the substrate supported by the stage, and a shifter to relatively move the stage with the gas supply portion.

As a result, the drying treatment can be performed, for example, with the substrate being scanned. Therefore an entire surface of the substrate can be preparatorily dried in a uniform and efficient manner. Further, drying conditions can be easily changed by moving the stage and the gas supply portion in an approaching/departing direction to/from each other.

Further, in the apparatus for fabricating the device of the invention, the deposition unit employs a design that includes a unit to discharge the droplets capable of quantitatively dropping the liquid material.

Thus, the high-mix low-volume production of the device can be realized.

An apparatus for fabricating the device of the invention includes a preparatory dryer to relatively move the gas above the surface of the substrate to the substrate, and a deposition unit to supply the liquid material on the substrate.

According to the apparatus for fabricating the device, since the preparatory dryer to preparatorily dry the liquid material placed on the substrate in the deposition unit is designed to relatively move the gas above the surface of the substrate to the substrate, the preparatory drying can be easily performed even if the substrate is not removed from the stage of the unit to dispose the liquid material. Moreover, since the substrate is not always required to be heated during the preparatory drying, the load due to the heating is reduced on the substrate and material. Further, the heater can be omitted, and thus costs are reduced.

A device of the invention is fabricated by the above apparatus for fabricating the device.

According to the invention, a low-cost and inexpensive device is provided because it is fabricated by the apparatus for fabricating the device of the invention.

An electronic equipment of the invention incorporates the above device such that the device is mounted thereon. According to the invention, a low-cost, inexpensive electronic equipment is provided.

The unit to discharge the droplets in the invention can include an inkjet unit having a discharge head. The discharge head of the inkjet unit can quantitatively discharge the liquid material via an inkjet method, and drop, for example, 1 to 300 nanograms, of the liquid material (fluid) in an intermittent and quantitative manner.

By using the inkjet method as the stacking method of the material layers, the material layers can be disposed in an optional thickness at any location providing inexpensive equipment.

A dispenser unit is also usable as the unit to discharge the droplets.

The inkjet method may be a piezojet method to discharge the fluid (liquid material) by a volume change of a piezoelectric element, or a method to discharge the fluid by rapid babble generation upon heating.

The fluid means a medium having a viscosity that enables discharging from the nozzle of the discharge head. The fluid can be water based or oil based. It is enough to have a fluidity (viscosity) which enables discharging from the nozzle, and even if solid material is incorporated, the fluid is usable when it is fluidic as a whole. In addition, material contained in the fluid may be, besides the material as fine particles dispersed in the solvent, a material heated and solved above the melting point, or a material to which a dye, pigment or other functional material is added besides the solvent. In addition, the wiring pattern (electric circuit), which is a component formed by an electrically cooperated relationship among circuit elements, has a specific electric characteristic or particular electric property. In addition, the substrate is not only a flat substrate, but also may be a curved substrate. Further, the patterning surface need not have a high hardness, and it may be a surface of a flexible material, such as film, paper, or rubber, besides glass, plastic, or metal.

BRIEF DESCRIPTION OF THE DRAWINGS

FIGS. 10(*a*)-10(*e*) are schematics showing an example of the method for fabricating the electro-optic apparatus of the invention;

DETAILED DESCRIPTION OF PREFERRED EMBODIMENTS

Hereinafter, the apparatus for fabricating the device of the invention is described with reference to FIG. 1 to FIG. 3.

Figure 1:
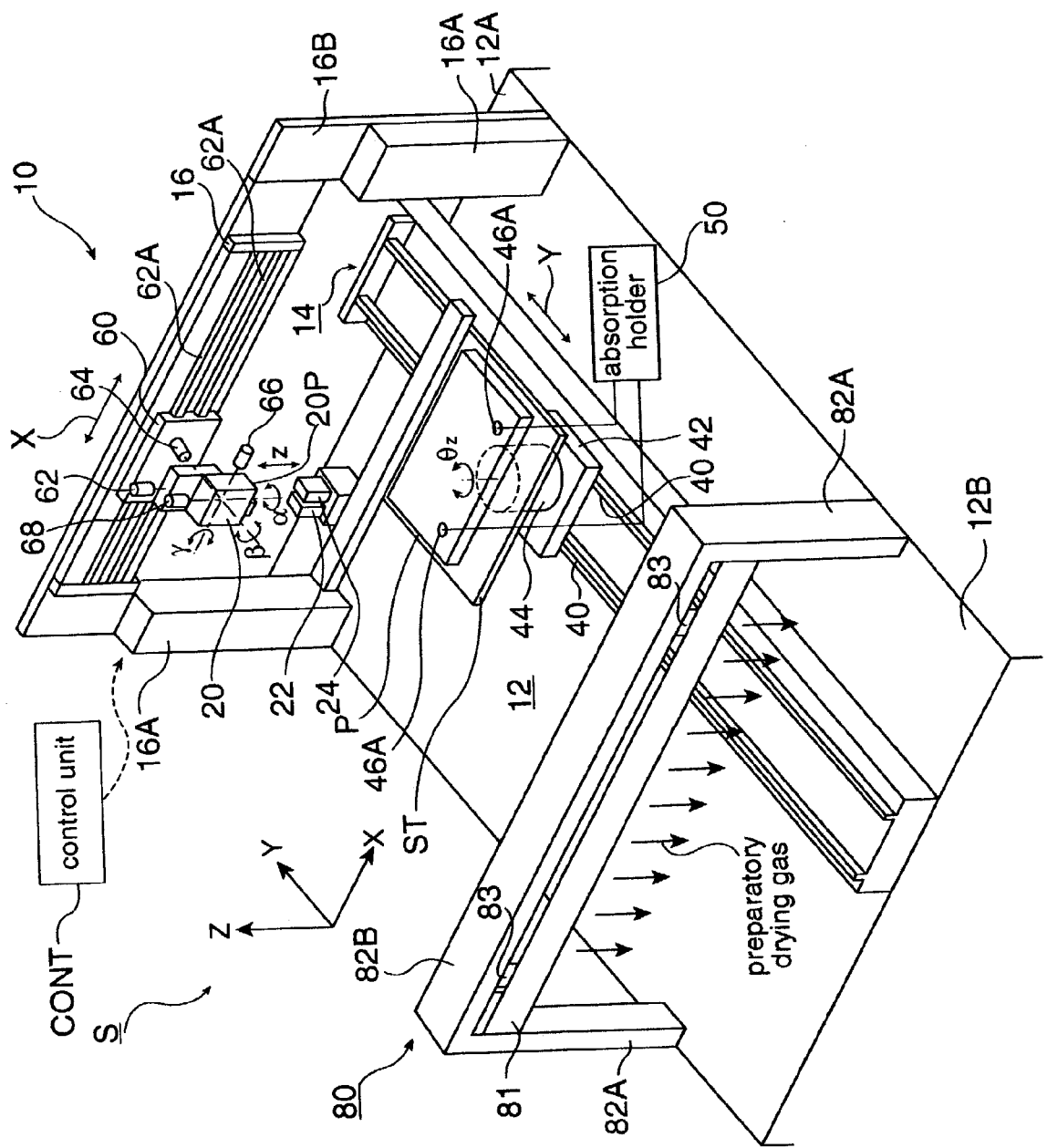
FIG. 1 is a schematic perspective view showing an exemplary embodiment of the apparatus for fabricating a device of the invention.
Figure 2:
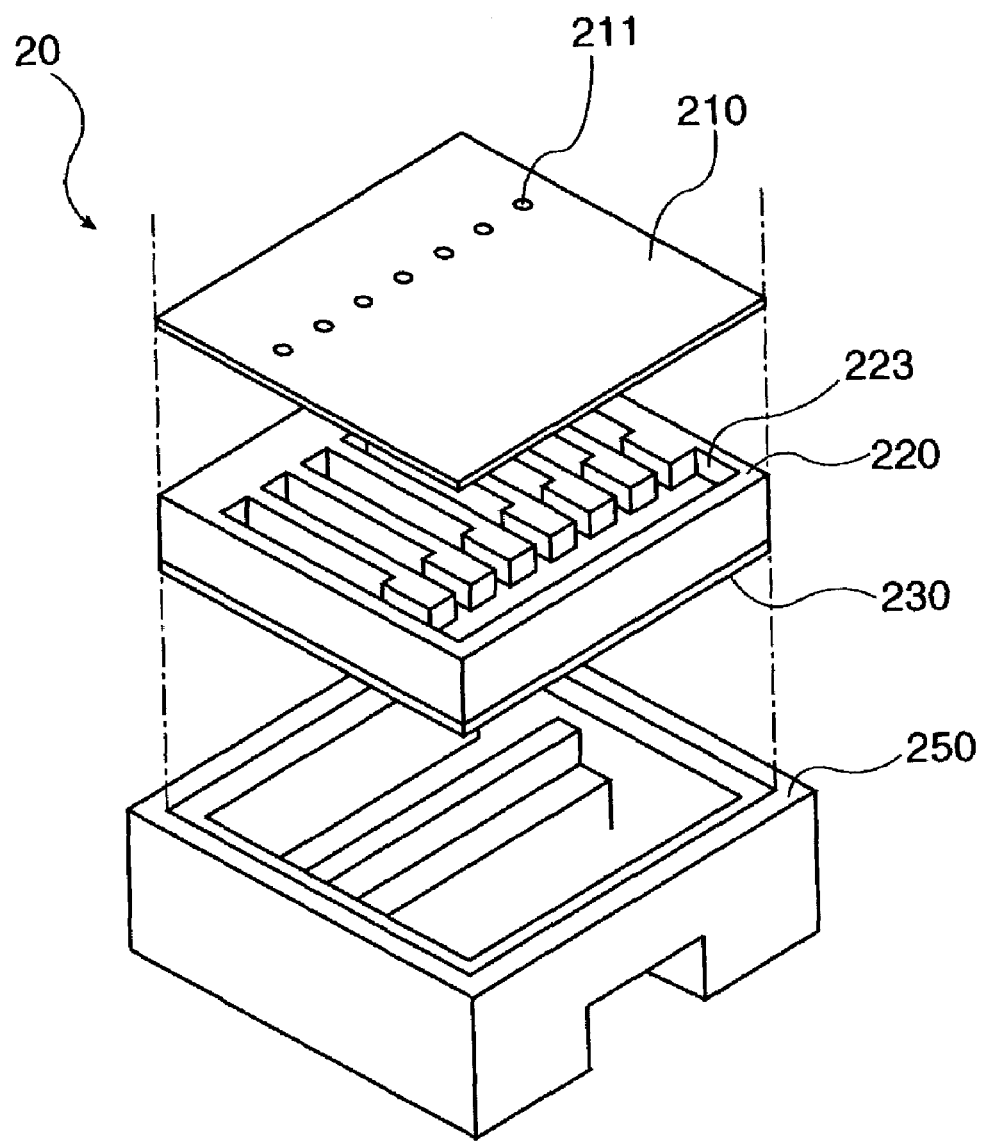
FIG. 2 is an exploded perspective view of a discharge head.
Figure 3:
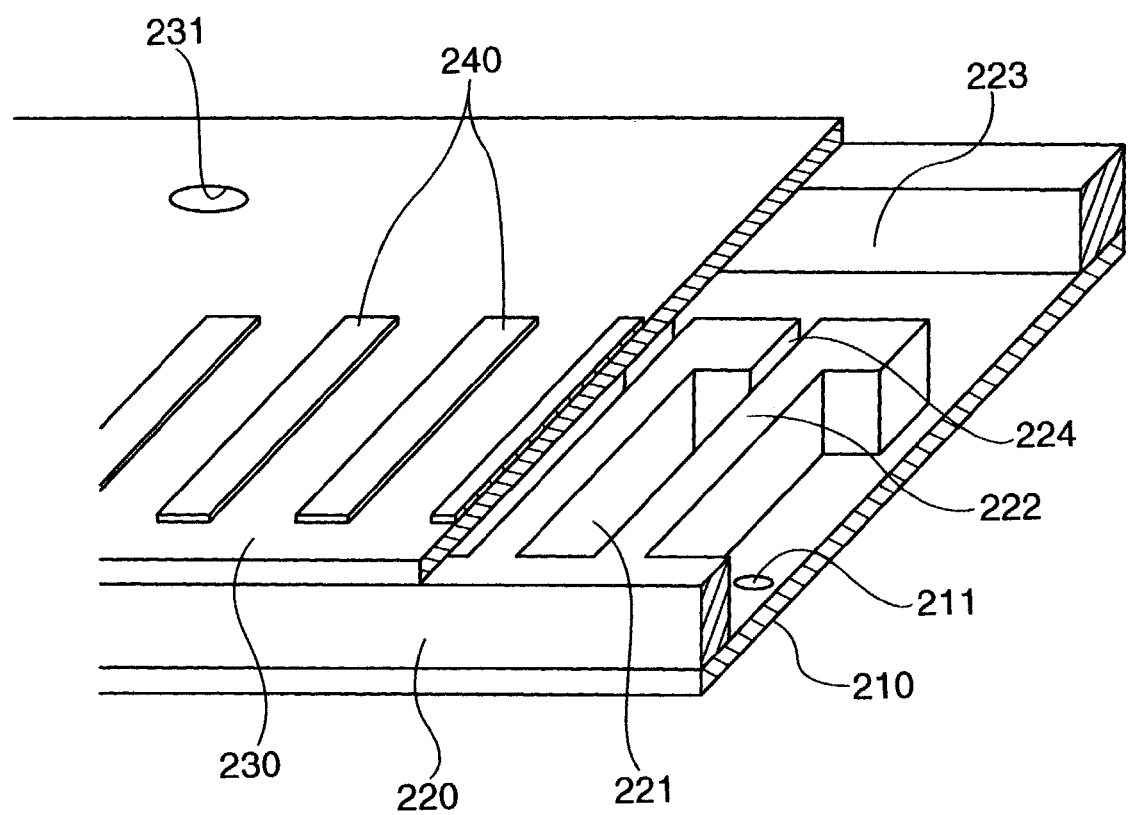
FIG. 3 is a partial sectional perspective view of a significant part of the discharge head.

FIG. 1 is a schematic perspective view showing the apparatus for fabricating the device of the invention, and FIG. 2 and FIG. 3 are schematics showing the discharge head.

In FIG. 1, the apparatus S for fabricating the device has a deposition unit 10 capable of disposing the liquid material on a substrate P, and a preparatory dryer 80 for preparatorily drying the liquid material disposed on the substrate P. The deposition unit 10 is a unit to discharge the droplets (inkjet unit) capable of supplying the liquid material in a predetermined pattern.

Although, the deposition unit 10 is described as the inkjet unit in the following description, it is not particularly limited to the inkjet unit, and may be any unit capable of disposing the liquid material on the substrate P, for example, a screen printing method may be used to dispose the liquid material on the substrate P.

In FIG. 1, the deposition unit 10 has a base 12, a stage ST placed on the base 12 to support the substrate P, a first shifter (moving unit) 14 positioned between the base 12 and stage ST to movably support the stage ST, a discharge head (unit to discharge the droplets) 20 capable of quantitatively discharging (dropping) the liquid material or fluid containing a predetermined material to the substrate P supported by the stage ST, and a second shifter 16 to movably support the discharge head 20. On the base 12, an electronic balance (not shown) as a weight measure, a capping unit 22, and a cleaning unit 24 are provided.

Further, the apparatus S for fabricating the device has a preparatory dryer 80 to blow a gas heated at a predetermined temperature to the substrate P supported by the stage ST. The preparatory dryer 80 has a gas supply portion 81 to supply a heated gas to the substrate P, and the gas supply portion 81 is placed at a position opposed to the substrate P supported by the stage ST.

Then, a control unit CONT controls operations of the apparatus S, for fabricating the device, including the operation of the discharge head 20 to discharge the liquid material, the gas supply operation of the portion 81 to supply the heated gas, and the moving operation of the first shifter 14 and the second shifter 16.

Here, although only one discharge head 20 is shown in FIG. 1, the inkjet unit 10 has multiple discharge heads 20, and each of these multiple discharge heads 20 discharges a different type or same type of liquid material.

The first shifter 14 is provided on the base 12, and positioned along the Y-axis. The second shifter 16 is mounted vertically against the base 12 using poles 16A, 16A, and mounted in the rear 12A of the base 12. The X-axis direction (the second direction) of the second shifter 16 is perpendicular to the Y-axis direction (the first direction) of the first shifter 14. The Y-axis direction is a direction along the front 12B and rear 12A of the base 12. On the contrary, X-axis direction is a direction along the longitudinal direction of the base 12, and each direction is horizontal. In addition, the Z-axis direction is perpendicular to the X-axis and Y-axis directions.

The first shifter 14 includes, for example, a linear motor and has guide rails 40, 40, and a slider 42 provided movably along the guide rail 40. The slider 42 of the first shifter 14 in the linear motor type can be moved to be positioned in the Y-axis direction along the guide rail 40.

In addition, the slider 42 has a motor 44 for rotation about Z-axis ($\theta z$). This motor 44 is, for example, a direct drive motor, and the rotor of the motor 44 is fixed to the stage ST. As a result, upon energization of the motor 44, the rotor and stage ST can rotate along the $\theta z$ direction and index the stage ST (rotational identification). That is, the first shifter 14 can move the stage ST in the Y-axis direction (the first direction) and $\theta z$ direction.

The stage ST holds the substrate P, and positions it at a certain location. In addition, the stage ST has an absorption holder 50, and absorbs and holds the substrate P on the stage ST through a hole 46A in the stage ST by operating the absorption holder 50.

The second shifter 16 includes a linear motor, and has a column 16B fixed to poles 16A, 16A, a guide rail 62A supported by the column 16B, and a slider 60 supported movably in the X-axis direction along the guide rail 62A. The slider 60 can be moved in the X-axis direction along the guide rail 62A and positioned, and the discharge head 20 is mounted on the slider 60.

The discharge head 20 has motors 62, 64, 66, 68 as an oscillating positioner. When the motor 62 is actuated, the discharge head 20 can be moved vertically along the Z-axis and positioned. The Z-axis is perpendicular to each of the X-axis and Y-axis (vertical direction). When the motor 64 is actuated, the discharge head 20 can be oscillated to be positioned along $\beta$ direction about the Y-axis. When the motor 66 is actuated, the discharge head 20 can be oscillated to be positioned along $\gamma$ direction about the X-axis. When the motor 68 is actuated, the discharge head 20 can be oscillated to be positioned along $\alpha$ direction about the Z-axis. That is, the second shifter 16 supports the discharge head 20 movably in the X-axis direction (the first direction) and Z-axis direction, and supports the discharge head 20 movably in $\theta x$ direction, $\theta y$ direction, and $\theta z$ direction.

In this way, the discharge head 20 in FIG. 1 can be moved and positioned linearly in the Z-axis direction and oscillated along $\alpha$, $\beta$, $\gamma$ and positioned on the slider 60, and for a surface 20P to discharge the liquid material of the discharge head 20, the position or orientation can be controlled exactly against the substrate P at the stage ST side. The surface 20P to discharge the liquid material of the discharge head 20 has multiple nozzles for discharging the liquid material.

FIG. 2 is an exploded perspective view showing the discharge head 20. As shown in FIG. 2, the discharge head 20 has a nozzle plate 210 having a nozzle 211, a pressure chamber substrate 220 having a diaphragm 230, and a chassis 250 to fittingly support the nozzle plate 210 and diaphragm 230. The main portion of the discharge head 20, as shown in the partially sectional view of FIG. 3, has a structure in which the pressure chamber substrate 220 is interposed between the nozzle plate 210 and diaphragm 230. In the nozzle plate 210, the nozzle 211 is formed at a position that will correspond to the cavity (pressure chamber) 221 when the plate is pasted with the pressure chamber substrate 220. In the pressure chamber substrate 220, multiple cavities 221 are formed by etching a silicon single-crystal substrate in such a manner that each cavity can function as the pressure chamber. The space between cavities 221 is separated by a sidewall (partition) 222. Each cavity 221 is connected to a reservoir 223 as a common flow channel through a supply port 224. The diaphragm 230 includes, for example, a thermally oxidized film. The diaphragm 230 has a tank port 231 for the liquid material, and is in a design where any liquid material can be supplied from a not-shown tank (fluid container) through a pipe (flow channel). A piezoelectric element 240 is formed at a position corresponding to the cavity 221 on the diaphragm 230. The piezoelectric element 240 has a structure in which a crystalline piezoelectric ceramic, such as a PZT element, is interposed between upper and lower electrodes (not shown). The piezoelectric element 240 is constructed to be able to generate the volume change in response to a discharging signal fed from the control unit CONT.

To discharge the liquid material from the discharge head 20, first, the control unit CONT feeds the discharging signal, to discharge the liquid material, to the discharge head 20. The liquid material flows into the cavities 221 in the discharge head 20, and, in the discharge head 20 to which the discharging signal is fed, the piezoelectric element 240 of the head changes the volume due to the voltage applied between the upper and lower electrodes of the element. This volume change makes the diaphragm 230 transform, and thus makes the volume of the cavity 221 change. As a result, the droplets of the liquid material are discharged from the nozzle 211 of the cavity 221. The liquid material, reduced due to the discharge is newly supplied from the tank into the cavity 221 from which the liquid material was discharged.

Although the discharge head is in a design where the liquid material is discharged by causing the piezoelectric element to change its volume, the head may be constructed so that the droplets are discharged by heating and expanding the liquid material using a heating element.

The electronic balance (not shown) receives, for example, 5000 droplets of the droplets from the nozzle of the discharge head 20 to measure and control the weight of one droplet of the droplets discharged from the nozzle of the discharge head 20. The electronic balance can exactly measure the weight of one droplet of the droplets by dividing the weight of the 5000 droplets of the droplets by the number, 5000. The amount of the droplets discharged from the discharge head 20 can be optimally controlled based on the measurement of the droplets.

The cleaning unit 24 can clean the nozzle of the discharge head 20 regularly or optionally during the fabrication process of the device or during waiting. The capping unit 22 puts a cap on the surface 20P to discharge the liquid material of the discharge head 20, during waiting when the device is not fabricated, not to dry the surface 20P to discharge the liquid material of the discharge head 20.

The discharge head 20 is moved in the X-axis direction by the second shifter 16, thereby the discharge head 20 can be selectively positioned above the electronic balance, cleaning unit 24, or capping unit 22. That is, even when fabrication of the device is in operation, the weight of the droplets can be measured by moving the discharge head 20, for example, to the electronic balance side. Also, the discharge head 20 can be cleaned by moving the discharge head 20 above the cleaning unit 24. The cap can be put on the surface 20P to discharge the liquid material of the discharge head 20 to prevent the surface from drying or to reduce such drying by moving the discharge head 20 above the capping unit 22.

That is, the electronic balance, cleaning unit 24, and capping unit 22 are disposed spaced from the stage ST directly below the moving path of the discharge head 20 at a rear edge side on the base 12. Since an operation of the substrate P to supply/remove the material to/from the stage ST is performed at a front-edge of the base 12, the operation is not disturbed by the electronic balance, cleaning unit 24, or capping unit 22.

The substrate P has a patterning area with a top on which the wiring pattern (electric circuit) is formed. To form the wiring pattern, the liquid material is discharged from the discharge head 20 to the patterning area of the substrate P. The liquid material includes a material to form the device, such as a metal dispersed in a predetermined solvent to form the wiring pattern.

Referring back to FIG. 1, the preparatory dryer 80 has poles 82A, 82A, and a column 82B fixed to the poles 82A, 82A. The gas supply portion 81 is supported by the column 82B through a third shifter (moving unit) 83. The third shifter 83 includes, for example, an air cylinder, and supports the gas supply portion 81 in a manner where the shifter can move the gas supply portion 81 up and down along the Z-axis. The gas supply portion 81 for which the X-axis direction is the longitudinal direction has multiple nozzles for gas supply, oriented downward (−Z-axis direction), along the longitudinal direction. Therefore, the gas from the gas supply portion 81 is discharged downward.

The guide rail 40 of the first shifter 14 extends to a lower area of the gas supply portion 81 of the preparatory dryer 80, and the stage ST supporting the substrate P is provided in a movable manner to the lower area of the gas supply portion 81. Therefore, the gas from the gas supply portion 81 is blown to the substrate P from the upper area (from the right above side) by moving the substrate P by the stage ST to the lower area of the gas supply portion 81.

A not-shown gas supply is connected to the gas supply nozzle of the gas supply portion 81 through piping (flow channel) that has flexibility, such as a rubber piping. The gas supply has a heater, and the gas supply supplies a gas heated at a predetermined temperature in the heater to the gas supply portion 81. The heater is controlled by the control unit CONT, and the gas heated at the predetermined temperature in the heater is brown from the gas supply nozzle of the gas supply portion 81 to the substrate P supported by the stage ST.

Figure 4:
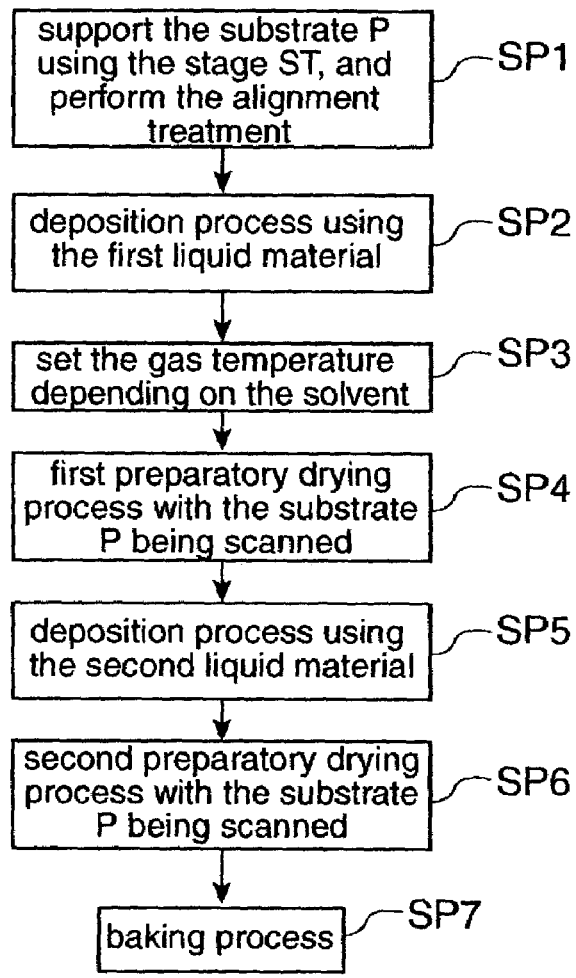
FIG. 4 is a flow chart showing an exemplary embodiment of the method for fabricating the device of the invention.

Next, a procedure of stacking multiple material layers on the substrate P using the apparatus S for fabricating the device described above is described with reference to the flow chart of FIG. 4.

First, the substrate P is loaded on the stage ST. The stage ST absorbs and holds the substrate P with an absorption holder 50. The control unit CONT performs the alignment of the stage ST supporting the substrate P with the discharge head 20 (step SP1).

That is, the control unit CONT positions the stage ST at a place using the first shifter 14 and motor 44, and positions the discharge head 20 at a place using the second shifter 16 and motors 62, 64, 66, 68. The stage ST supporting the substrate P is positioned below the discharge head 20.

The control unit CONT discharges a first liquid material from the discharge head 20 to the substrate P subjected to the alignment treatment (step SP2).

The control unit CONT, while moving the stage ST relatively with the discharge head 20, discharges the first liquid material from the discharge head 20, and positions the first liquid material in a predetermined pattern on the substrate P. The pattern of the first liquid material is formed (deposited) on the substrate P.

The control unit CONT produces the heated gas from the gas supply portion 81. At that time, temperature of the gas from the gas supply portion 81 is set up depending on the solvent in the first liquid material (step SP3).

That is, the temperature of the gas is preset at a level such that the solvent contained in the liquid material can be eliminated by blowing the gas to the first liquid material. The control unit CONT has prerecorded data for the process, that is, data for the boiling point of the solvent used in the first liquid material, and sets up the temperature of the gas based on the recorded data.

In this exemplary embodiment, the temperature of the gas supplied from the gas supply portion 81 is set to about 100° C. When the solvent contained in the liquid material has a higher boiling point, the temperature of the gas produced from the gas supply portion 81 is set higher according to the solvent. On the other hand, when the solvent contained in the liquid material has a lower boiling point, the gas temperature can be set lower according to the solvent. By setting the gas temperature as low as possible according to the solvent, the load due to the heating can be reduced on the substrate and material.

Then, the control unit CONT moves the stage ST supporting the substrate P, on which the liquid material is disposed, to the vicinity of the gas supply portion 81 of the preparatory dryer 80 in −Y-axis direction with the first shifter 14. Then, the control unit CONT, while moving the stage ST in the Y-axis direction, blows the gas heated at the predetermined temperature from the gas supply portion 81 to the substrate P from the right above side, and performs the preparatory drying (preparatory baking) for the first liquid material (step SP4).

Figure 5:
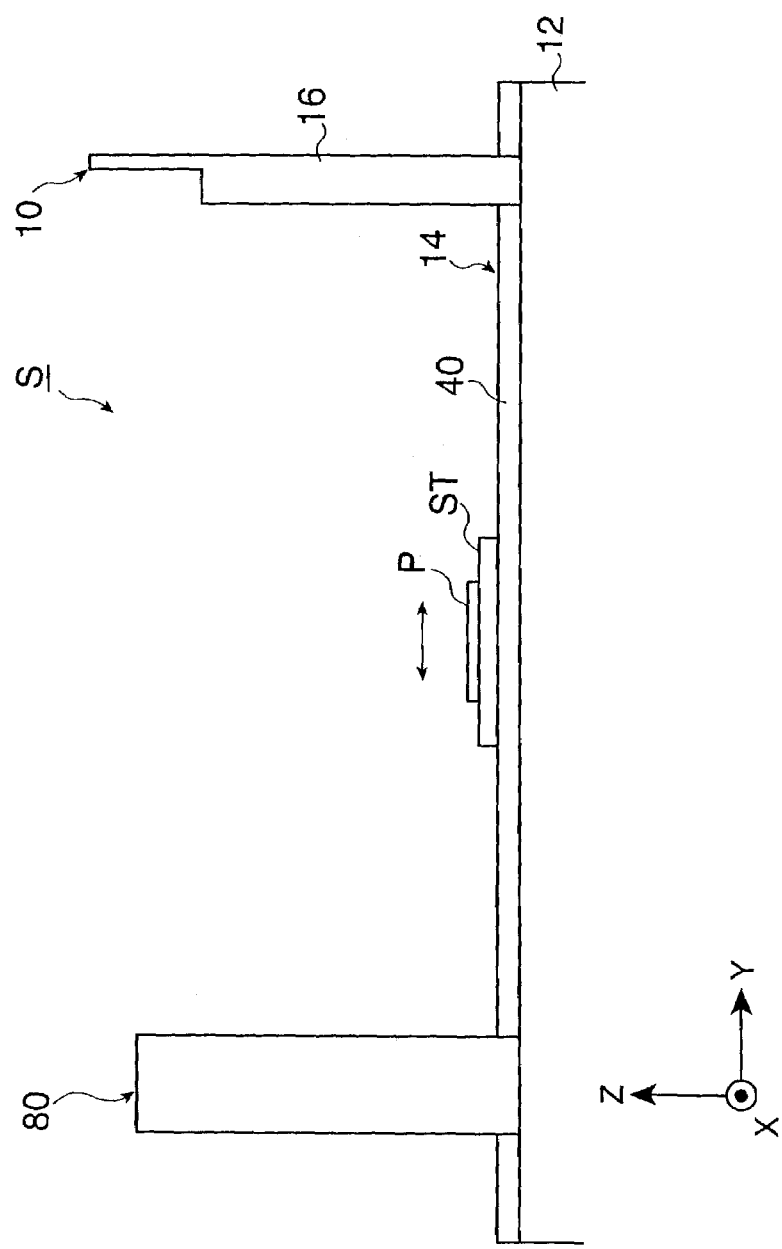
FIG. 5 is a schematic describing the method for fabricating the device of the invention.

That is, the substrate P is blown with the heated gas while being scanned in the Y-axis direction. This allows the gas blown uniformly over the entire surface of the substrate P. During changing from the deposition process of the first liquid material (step SP2) to the preparatory drying process for the first liquid material (step SP4), the substrate P is not removed from the stage ST (refer to the schematic of FIG. 5).

In the preparatory drying process for the first liquid material, travel speed of the stage St (i.e. scan rate for the substrate P) is optimally controlled by the control unit CONT. The control unit CONT, depending on the used material and a material type of the substrate P, set the optimum scan rate or time to blow the gas to the substrate P. The wind velocity of the gas blown to the substrate P is also optimally set depending on the material and substrate. At that time, the control unit CONT optimally sets the wind velocity of the gas and the blowing time to such a degree that the liquid material provided on the substrate P may not be moved by the gas blow.

That is, the control unit CONT optimally controls respective parameters including the temperature of the gas blown to the substrate P, wind velocity, time, and airflow, depending on the solvent in the liquid material, physical properties of the material, and the substrate. The control unit CONT performs the control based on the recorded data on the process (such as physical properties of the used solvent, physical properties of the material, and physical properties of the substrate).

Since the gas supply portion 81 is provided in a movable manner in the Z-axis direction by the third shifter 83, the control unit CONT can perform the preparatory drying with adjusting the distance between the gas supply portion 81 and the substrate P using the third shifter 83, for example, to such a degree that the material is not damaged, or to such a degree that the liquid material may not be moved, depending on the thickness of the substrate P, solvent of the liquid material, and physical properties of the material.

After the first preparatory drying process has been completed for the first liquid material, the control unit CONT moves the stage ST in the +Y-axis direction, and performs the deposition process (imaging process) of the second liquid material to the substrate P using the discharge head 20 (step SP5).

During changing from the preparatory drying process for the first liquid material (step SP4) to the deposition process of the second liquid material (step SP5), the substrate P is not removed from the stage ST.

After the deposition process of the second liquid material has been completed, the control unit CONT moves the stage ST to the preparatory dryer 80, and performs the preparatory drying process for the second liquid material while moving the stage ST in the Y-axis direction (step SP6).

During changing from the deposition process of the second liquid material (step SP5) to the preparatory drying process for the second liquid material (step SP6), the substrate P is not removed from the stage ST.

The control unit CONT optimally controls respective parameters including the gas temperature blown to the substrate P, wind velocity, time (scan rate for the stage ST), and airflow, depending on the solvent in the second liquid material, physical properties of the material, and substrate. The control unit CONT performs the control based on the recorded data on the process.

In this case, the control unit CONT can also perform the preparatory drying adjusting the distance between the gas supply portion 81 and substrate P using the third shifter 83.

In the above manner, the deposition process of disposing the liquid material on the substrate P, and the preparatory drying process of eliminating the solvent from the liquid material by blowing the gas heated at the predetermined temperature to the substrate P on which the liquid material is disposed, are repeated plural times, then the baking process is performed for the substrate P (step SP7).

In the baking process, the substrate P is removed from the stage ST, and conveyed to the baking unit, such as a hotplate, electric oven, and infrared oven. The substrate P is heated, for example, at a temperature of 300° C. or more for 30 minutes or more in the baking unit, and is thereby baked. The baking unit is initially set to the room temperature (about 25° C.), and the substrate P to be baked is positioned in the baking unit at the room temperature. Then, the substrate P is heated under a setting of a heating temperature of, for example, 10° C./min or less, and set to be at a fixed temperature and heated, for example, for 30 minutes when the temperature increases to 300° C. or more. Then, the substrate P is cooled under a setting of a cooling rate of 10° C./min or less, and brought out from the baking unit when the temperature decreases to the room temperature.

In this way, the multiple material layers are stacked on the substrate P, and the multilayer-interconnection pattern is formed.

As described above, when the preparatory drying treatment is performed to eliminate the solvent from the liquid material disposed on the substrate P, the preparatory drying is performed by blowing the gas heated at a predetermined temperature to the substrate P on which the liquid material is provided. Therefore, the preparatory drying can be easily performed in a simple design in the preparatory drying treatment, even if the substrate P is not removed from the stage ST. Therefore, the operation efficiency can be enhanced, and cost reduction is achieved.

Although, it has been described in the exemplary embodiment that the nozzle of the gas supply portion 81 is fixed, the nozzle direction may be movable and an angle of the gas blown to the substrate P may be varied. Alternatively, porous material may be disposed instead of the nozzle (or at the tip of the nozzle) to blow the gas to the substrate P through the porous material. In this way, the gas can be blown uniformly to the substrate P.

Although it has been described in the exemplary embodiment that the substrate P is blown by the gas with the substrate being moved by the stage ST, naturally, the preparatory dryer 80 side may be moved. Both the stage ST and the preparatory dryer 80 may be moved. Further, although it has been described that the distance between the substrate P and gas supply portion 81 is adjusted by moving the gas supply portion 81 in the Z-axis direction, the stage ST may be provided movably in the Z-axis direction, and the distance between the substrate P and gas supply portion 81 may be adjusted by moving the stage ST in the Z-axis direction. Naturally, both the stage ST and the gas supply portion 80 may be moved in the Z-axis direction.

In addition, although the preparatory drying is performed in the exemplary embodiment by blowing the heated gas heated by the heater to the substrate, the preparatory drying does not always require heating. That is, the preparatory drying may be performed, without heating the substrate, by moving the gas above the surface of the substrate on which the liquid material is disposed relatively to the substrate, in the preparatory drying treatment of the liquid material disposed on the substrate.

Specifically, for example, it is preferable to blow an unheated gas to the substrate. As the supplied gas, for example, an inert gas, such as nitrogen gas that is inactive to the liquid material, may be used in addition to air. The gas temperature is, for example, nearly equal to the ambient temperature environing the disposed substrate. Thus, the gas (air) above the surface of the substrate moves relatively to the substrate, the vapor pressure above the surface of the substrate reduces, and the liquid material vaporizes increasingly.

Alternatively, the substrate may be simply moved on the unit. That is, for example, the substrate is reciprocated within a predetermined region, thereby the gas (air) above the surface of the substrate moves relatively to the substrate, the vapor pressure above the surface of the substrate reduces, and the liquid material vaporizes increasingly. Naturally, the substrate may be moved while being blown by the unheated gas. As a result, the liquid material vapors more increasingly. In addition, it is possible to accelerate the vaporization of the liquid material by reducing atmosphere pressure above the surface of the substrate.

In this way, by moving the gas above the surface of the substrate on which the liquid material is disposed relatively to the substrate, heating of the substrate is avoided in the preparatory drying. In the preparatory drying, it is sufficient to remove the solvent in the previously disposed liquid material on the substrate to some extent, in order to disposed the liquid material in a stacked manner, and the drying treatment can be performed in a short time without heating.

By avoiding the heating of the substrate in the preparatory drying treatment, the load due to the heating is reduced on the substrate or material. For instance, temperature rise in the substrate is apt to be a cause of thermal deformation of the substrate, and possibly a cause of deterioration, including a cause of a dimensional error of pattern. Therefore, by reducing a process requiring heating during the process of the device, deterioration of products due to the heating is restrained. Particularly, in case of a large substrate, the thermal deformation (including strain or flexure) is apt to be generated largely, and the unheated preparatory drying is advantageous is described before. Alternatively, even in case of a process requiring a precise temperature control, load for the control is reduced by the unheated preparatory drying. In addition, process trouble due to the heating is reduced because the ambient temperature is not largely changed.

Further, it is expected to achieve downsizing and cost reduction of the apparatus, such as omission of the heater, because heating is unnecessary in the preparatory drying treatment.

Next, an example of a method of forming a stacked wiring pattern on the substrate P by discharging the liquid material from the discharge head 20 to the substrate P and stacking the multiple material layers on the substrate P using the apparatus S, for fabricating the device with the design described above is described.

In the following description, by way of example, a procedure of fabricating an organic EL (electroluminescence) display device and TFT (thin film transistor) to drive the device is shown.

The EL display device, having a structure in which a thin film containing a fluorescent, inorganic or organic compound is interposed between a cathode and anode, is a device in which an electron and electron-hole (hole) are injected into the thin film and recombined with each other, thereby exciter (exciton) is generated, and light emission (fluorescence/phosphorescence) as the exciton is devitalized is used for luminescence.

Here, as above, the inkjet unit 10 has multiple discharge heads 20, and each of the discharge heads discharges the liquid material containing different material. The liquid material includes a material formed into fine particles that is made into a paste with solvent and binder, and its viscosity is set to a viscosity where the discharge head 20 can discharge the material (for example, 50 cps or less). Among the multiple discharge heads, the liquid material containing the first material is discharged from the first discharge head to the substrate P and then preparatorily dried (preparatory baking), then the liquid material containing the second material is discharged from the second discharge head to the first material layer and then preparatorily dried (preparatory baking), after that, similar processes are performed using the multiple discharge heads, thereby the multiple material layers are stacked on the substrate P, and the multilayer-interconnection pattern is formed.

Figure 6:
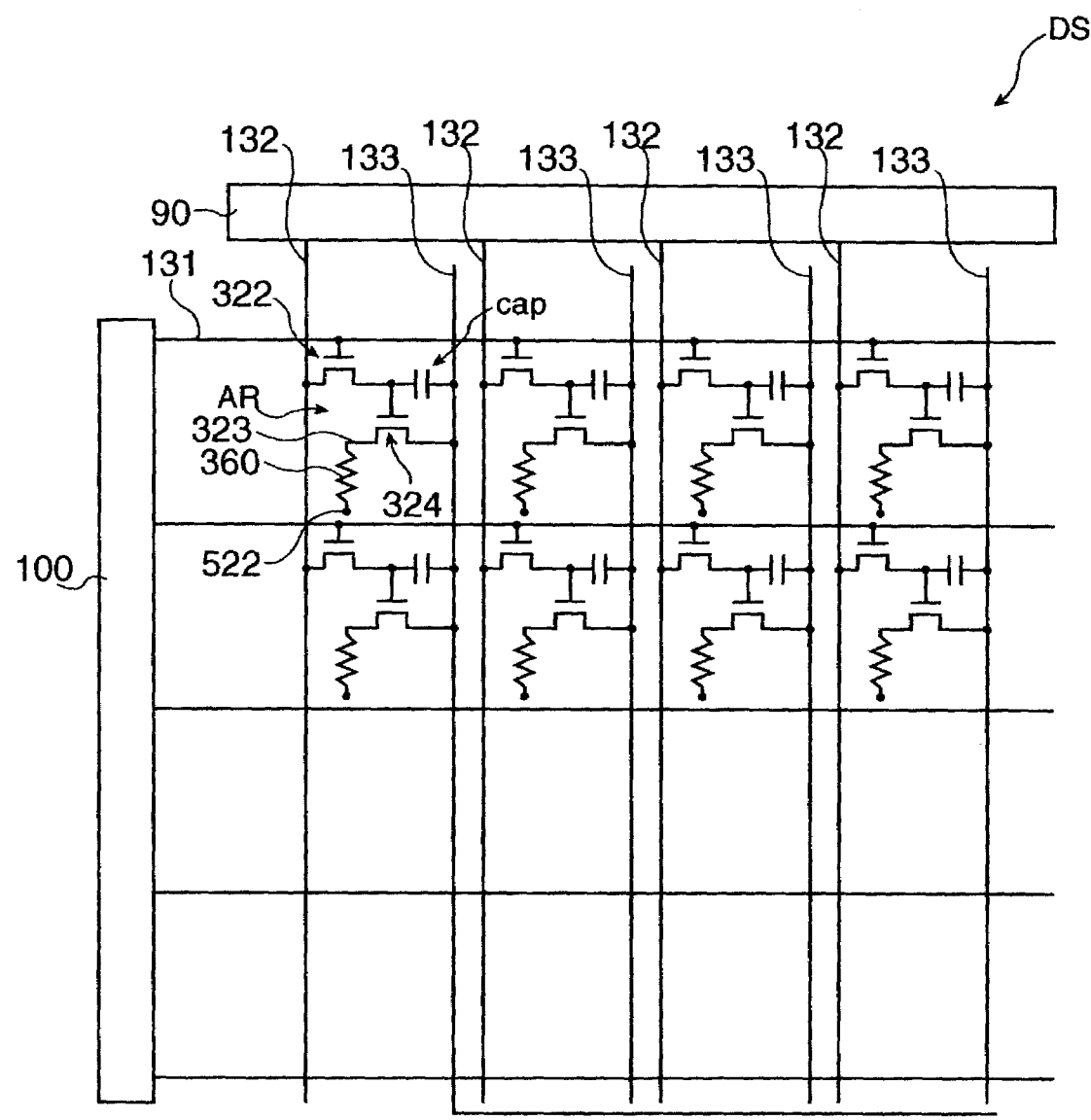
FIG. 6 is a circuit diagram showing an active-matrix type organic EL display apparatus.
Figure 7:
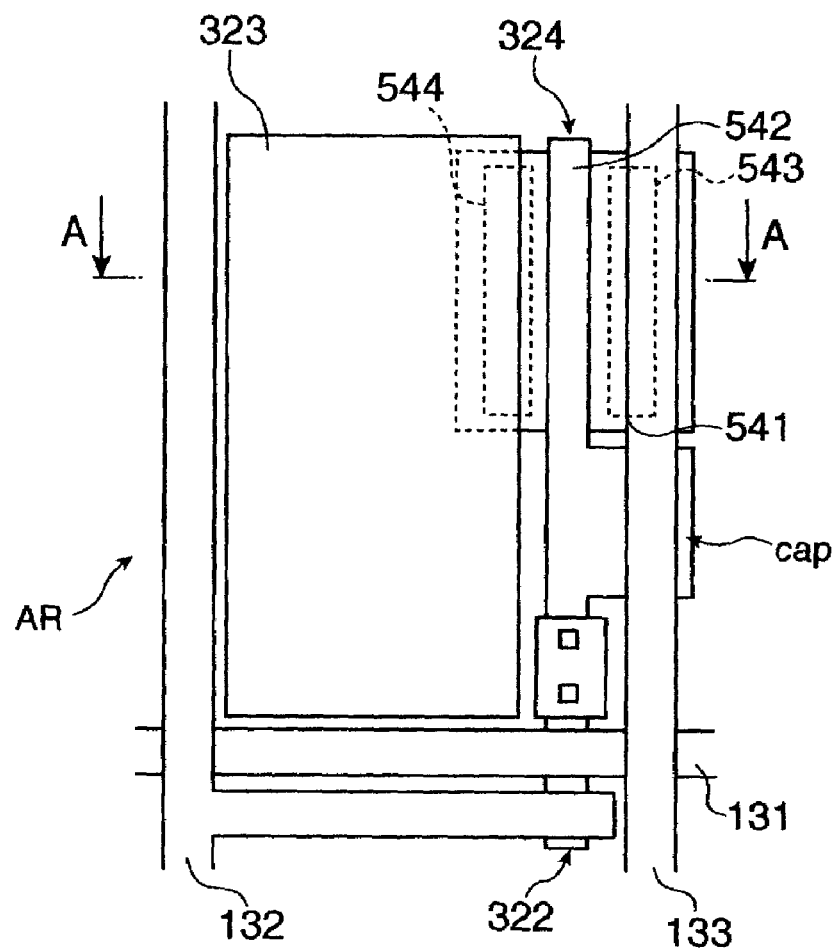
FIG. 7 is an expanded view showing a planar structure of a pixel portion in the display apparatus of FIG. 6.
Figure 8:
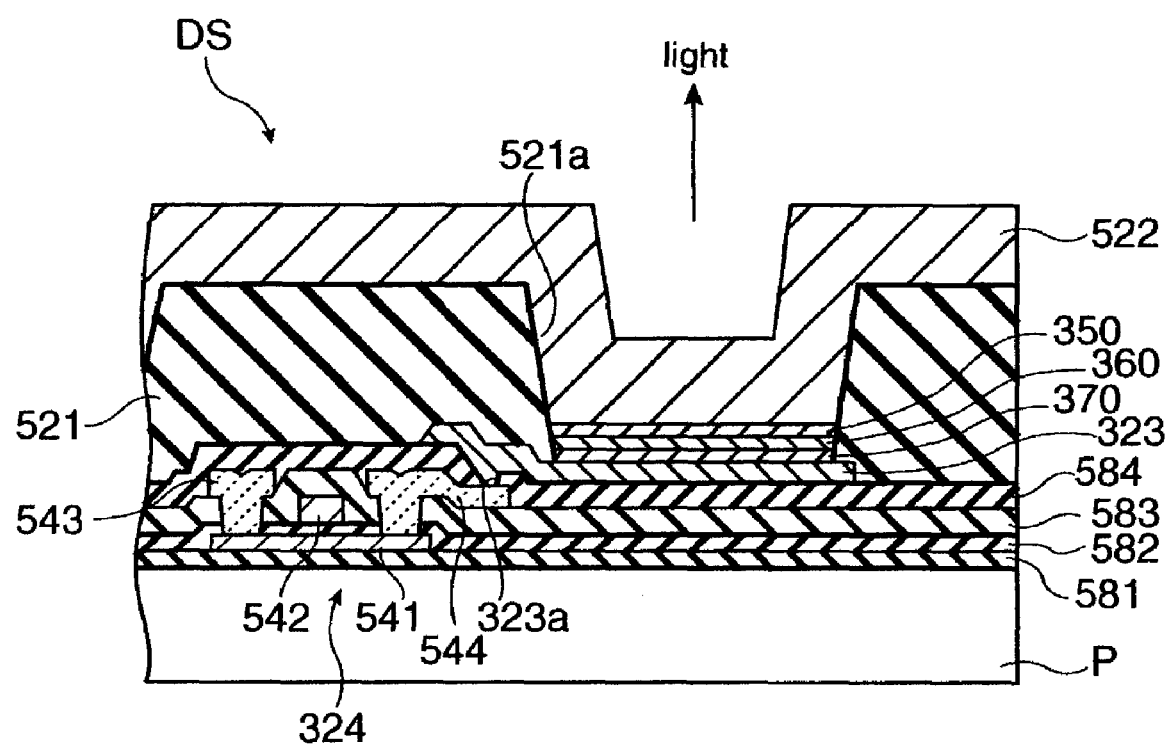
FIG. 8 is a sectional view showing an example of a layer structure of the organic EL display apparatus fabricated in the method for fabricating an electro-optic apparatus according to the invention.
Figure 9:
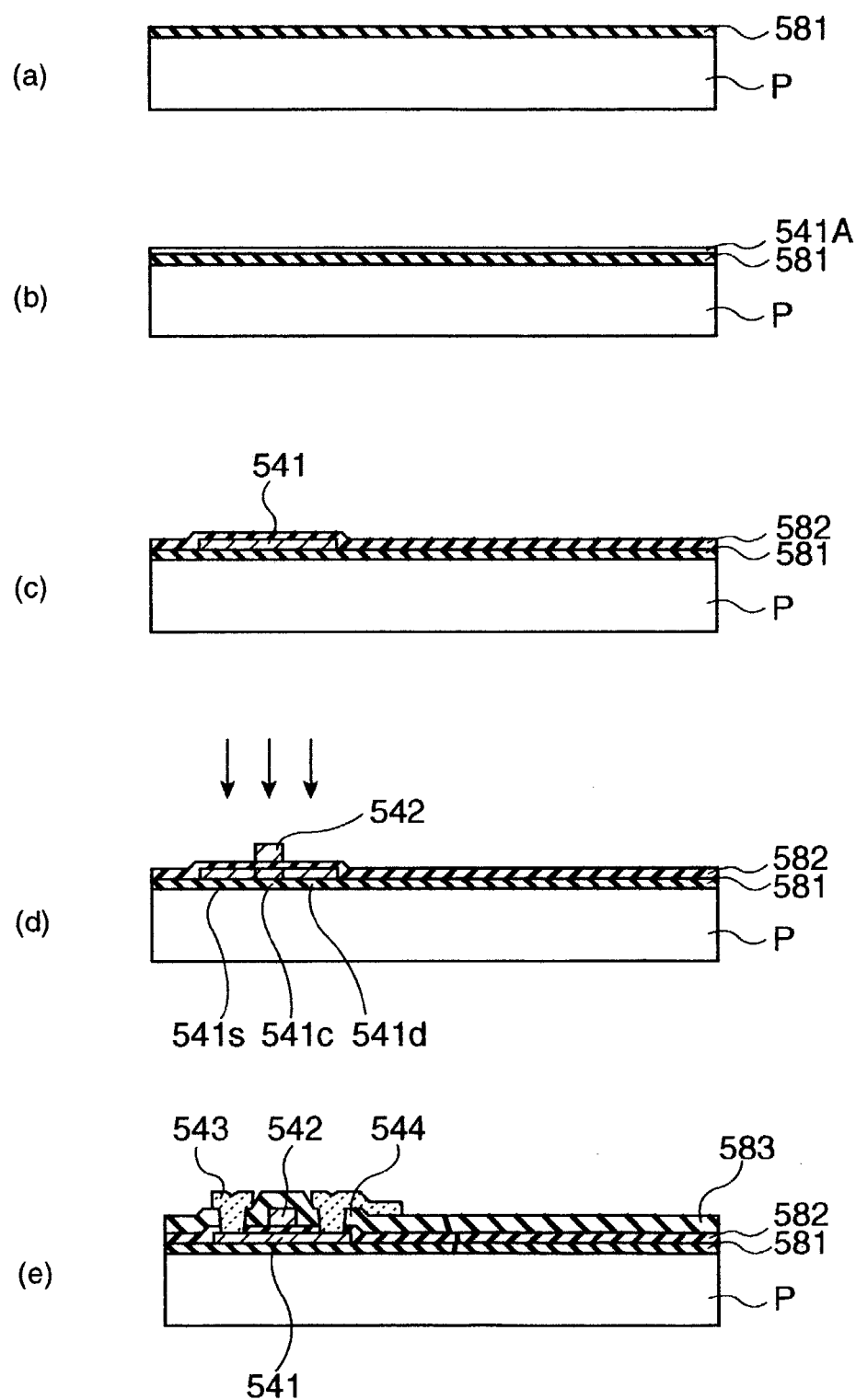
FIGS. 9(*a*)-9(*e*) are schematics showing an example of the method for fabricating an electro-optic apparatus of the invention.

FIG. 6, FIG. 7, and FIG. 8 are schematics showing an example of an active-matrix type display apparatus using the organic electroluminescence device, where FIG. 6 is a circuit diagram of the organic EL display apparatus, and FIG. 7 is an expanded plan view of a pixel portion in a condition where an opposite electrode and the organic electroluminescence device are removed.

As shown in the circuit diagram of FIG. 6, the organic EL display apparatus DS, including multiple scanning lines 131, multiple signal lines 132 extended in the intersecting direction across the scanning lines 131, and multiple common power lines 133 extended parallel to the signal lines 132 wired respectively on a substrate, is designed to have a pixel AR provided at each of intersections of the scanning lines 131 and signal lines 132.

A data-line driver circuit 90 having a shift register, level shifter, video lines, and analog switch is provided for the signal lines 132.

On the other hand, for the scanning lines 131, a scanning-line driver circuit 100 having a shift register and level shifter is provided. Each pixel region AR has a first thin film transistor 322 having a gate electrode to which a scanning signal is fed through the scanning line 131, a retention volume cap to retain a image signal fed from the signal line 132 through the first thin film transistor 322, a second thin film transistor 324 having a gate electrode to which the image signal retained by the retention volume cap is fed, a pixel electrode 323 into which a driving current is flown from the common power line 133 when the electrode 323 is electrically connected to the common power line 133 through the second thin film transistor 324, and a luminescence portion (luminescence layer) 360 interposed between the pixel electrode (anode) 323 and opposite electrode (cathode) 522.

In such a design, when the scanning line 131 is actuated and the first thin film transistor 322 turns on, electrical potential of the signal line 132 at that time is retained in the retention volume cap, and a conduction state of the second thin film transistor 324 is determined according to the state of the retention volume cap. Then, current flows from the common power line 133 to the pixel electrode 323 through a channel of the second thin film transistor 324, and current flows to the opposite electrode 522 through the luminescence layer 360, thereby the luminescence layer 360 emits light according to the current level flown therethrough.

The two-dimensional structure of the each pixel AR is, as shown in FIG. 7, is in an arrangement where respective sides of the pixel electrode 323 having a two-dimensional shape of rectangle are surrounded by the signal line 132, common power line 133, scanning line 131, and a not-shown scanning line for other pixel electrode.

FIG. 8 is a sectional view taken along plane A-A of FIG. 7 viewed from arrow direction. The organic EL display apparatus shown in FIG. 8 is a type where light is produced from an opposite side to the substrate P side on which the thin film transistor (TFT: Thin Film Transistor) was disposed, i.e., a so-called top emission type.

Materials to form the substrate P include glass, quartz, sapphire, or synthetic resins such as polyester, polyacrylate, polycarbonate, and polyetherketone. In case the organic EL display apparatus is the top emission type, the substrate may be even opaque, in that case, ceramic such as alumina, a metal sheet such as a stainless steel sheet to which an insulating treatment such as a surface oxidation treatment was performed, a thermosetting resin, and a thermoplastic resin can be used.

On the other hand, in a type where light is produced from the substrate side on which the TFT was disposed, i.e., a so-called back emission type, a transparent material is used for the substrate, the material including a light-transmissive, transparent or semitransparent material, for example, transparent glass, quartz, sapphire, or transparent synthetic-resins such as polyester, polyacrylate, polycarbonate, and polyetherketone. In particular, soda glass that is inexpensive is preferably used to form the substrate.

As shown in FIG. 8, the top emission type of organic EL display apparatus DS has the substrate P, the anode (pixel electrode) 323 including a transparent electrode material, such as indium-tin-oxide (ITO: Indium Tin Oxide), a hole transport layer 370 capable of transporting a hole from the anode 323, the luminescence layer (organic EL layer or electro-optic element) 360 containing an organic EL material as one of electro-optic materials, an electron transport layer 350 provided on the top of the luminescence layer 360, the cathode (opposite electrode) 522 which is provided on the surface of its electron transport layer 350 including aluminum (Al), magnesium (Mg), gold (Au), silver (Ag), or calcium (Ca), and the thin film transistor (hereinafter "TFT") 324 as a conduction controller which is formed on the substrate P and controls whether a data signal should be written into the pixel electrode 323 or not. The TFT 324 operates based on an operation instruction signal from the scanning line driver circuit 100 and data-line driver circuit 90, and controls conduction to the pixel electrode 323.

The TFT 324 is provided on a surface of the substrate P through a base protection layer 581 including mainly SiO2. The TFT 324 has a silicon layer 541 formed on the base protection layer 581, a gate insulating layer 582 provided on the top of the base protection layer 581 such that the layer 582 covers the silicon layer 541, a gate electrode 542 provided in an area opposed to the silicon layer 541 within the top of the gate insulating layer 582, a first interlayer insulating layer 583 provided on the top of the gate insulating layer 582 such that the layer 583 covers the gate electrode 542, a source electrode 543 connecting with the silicon layer 541 through a contact hole opened through both the gate insulating layer 582 and the first interlayer insulating layer 583, a drain electrode (first material layer) 544 provided at an opposed position to the source electrode 543 across the gate electrode 542, and connecting with the silicon layer 541 through the contact hole opened through both the gate insulating layer 582 and the first interlayer insulating layer 583, and a second interlayer insulating-layer (second material layer) 584 provided on the top of the first interlayer insulating layer 583 such that the layer 584 covers the source electrode 543 and drain electrode 544.

The pixel electrode 323 is disposed on the top of the second interlayer insulating layer 584, and the pixel electrode 323 is connected with the drain electrode (first material layer) 544 through a contact hole 323a provided on the second interlayer insulating layer (second material layer) 584. A third insulating layer (bank layer) 521 including a synthetic resin is provided between an area except the organic EL device is provided within the surface of the second interlayer insulating layer 584 and the cathode 522.

In the silicon layer 541, a region overlapped with the gate electrode 542 across the gate insulating layer 582 is defined as a channel region. In addition, in the silicon layer 541, a source region is provided at a source side of the cannel region, while a drain region is provided at a drain side of the cannel region. Among these, the source region is connected with the source electrode 543 through the contact hole opened through both the gate insulating layer 582 and the first interlayer insulating-layer 583. On the other hand, the drain region is connected with the drain electrode 544 comprising the same layer as the source electrode 543 through the contact hole opened through both the gate insulating layer 582 and the first interlayer insulating layer 583. The pixel electrode 323 is connected with the drain region of the silicon layer 541 through the drain electrode 544.

Next, a fabrication process of the organic EL display apparatus shown in FIG. 8 is described with reference to FIG. 9(a)-FIG. 10(e).

First, the silicon layer 541 is formed on the substrate P. When the silicon layer 541 is formed, initially, as shown in FIG. 9A, the base protection layer 581 including a silicon oxide film about 200 to 500 nm in thickness is formed on the surface of the substrate P in a plasma CVD method using TEOS (tetraethoxysilane) and oxygen gas as source materials.

Then, as shown in FIG. 9(b), temperature of the substrate P is set to about 350° C., and a semiconductor layer 541A including an amorphous silicon film about 30 to 70 nm in thickness is formed on the surface of the base protection film 581 in the plasma CVD method or an ICVD method. Then, the semiconductor layer 541A is subjected to a crystallization process in a laser annealing method, flash heating method, or solid-phase epitaxy method, and thus the semiconductor layer 541A is crystallized into a polysilicon layer. In the laser annealing method, for example, a line beam of eximer laser having a beam of 400 mm in longitudinal dimension is used, where the output power is set to, for example, 200 mJ/cm2. Regarding the line beam, the line beam is scanned such that an area corresponding to 90% of peak value of the laser power along the lateral dimension is superposed for each region.

Then, as shown in FIG. 9(c), the semiconductor layer (polysilicon layer) 541A is patterned to be an island-shaped silicon layer 541, and then, the gate insulating layer 582 including a silicon oxide or nitride film about 60 to 150 nm in thickness is formed on the surface in the plasma CVD method using the TEOS and an oxidation gas as source materials. The silicon layer 541 is to be the channel and source/drain regions of the second thin film transistor 324 shown in FIG. 6, however, a semiconductor film as the channel and source/drain regions of the first thin film transistor 322 is formed in a different sectional position. That is, although the two types of the transistors 322, 324 are formed at the same time, since they are formed in same procedure, in the following description, only the second thin film transistor 324 is described for the transistors, and description is omitted for the first thin film transistor 322.

The gate insulating layer 582 may include a porous silicon oxide film (SiO2 film). The gate insulating layer 582 including the porous SiO2 film is formed in a CVD method (chemical vapor deposition method) using Si2H6 and O3 as reactive gases. By using these reactive gases, a large particle of SiO2 is formed in the vapor, and the large particle of SiO2 deposits on the silicon layer 541 and base protection layer 581. Therefore, the gate insulating layer 582 has a number of voids within the layer and becomes porous. The gate insulating layer 582 is formed into a porous material, which makes the dielectric constant of the layer reduced.

H (hydrogen) plasma treatment maybe performed on the surface of the gate insulating layer 582. Thus, a dangling bond in a Si—O bond on a surface of the void is substituted for a Si—H bond, and moisture-absorption resistance of the film is improved. Another SiO2 layer can be provided on the surface of the gate insulating layer 582 subjected to the plasma treatment. In this way, the insulating layer having a low dielectric constant can be formed.

Also, the reactive gases in forming the gate insulating layer 582 in the CVD method may be Si2H6+O2, Si3H8+O3, or Si3H8+O2, in addition to Si2H6+O3. Further, in addition to the reactive gases, a reactive gas containing B (boron) or a reactive gas containing F (fluorine) can be used.

Further, the gate insulating layer 582 can be formed in the inkjet method. As the liquid material discharged from the discharge head 20 to form the gate insulating layer 582, a material, such as the SiO2 dispersed in an appropriate solvent to form into a paste, and a sol containing an insulating material can be used. The solution containing the insulating material may be a silane compound, such as tetraethoxisilane dissolved in an appropriate solvent, such as ethanol, or a composition containing a chelate salt of alminum, organic alkaline-metal salt, or organic alkaline-earth metal salt, the composition being prepared such that it includes only inorganic oxides after baking. The gate insulating layer 582 formed in the inkjet method is then preparatorily dried.

In forming the gate insulating layer 582 in the inkjet method, before performing the discharging operation for forming the gate insulating layer 582, a surface treatment to control affinity of the liquid material for the base protection layer 581 and silicon layer 541 may be performed. In this case, the surface treatment is a lyophilic treatment, such as a UV treatment or plasma treatment. In this way, the liquid material to form the gate insulating layer 582 is closely adhered to the base protection layer 581, and planarized.

Then, as shown in FIG. 9(d), a conductive film containing a metal, such as aluminum, tantalum, molybdenum, titanium, or tungsten is formed on the gate insulating layer 582 in a sputter method, then it is patterned, and the gate electrode 542 is formed. Then, a high-density phosphor ion is implanted in that condition, and the source region 541s and drain region 541d are formed in the silicon layer 541 in a self-aligning manner with respect to the gate electrode 542. In this case, the gate electrode 542 is used as a patterning mask. The area where the impurity was not induced is the channel region 541c.

Then, as shown in FIG. 9(e), the first interlayer insulating layer 583 is formed. The first interlayer insulating layer 583 includes a silicon oxide or nitride, or a porous silicon oxide film like the gate insulating layer 582, and is formed on top of the gate insulating layer 582 in a similar procedure to in the forming method of the gate insulating layer 582.

Further, the forming process of the first interlayer insulating layer 583 can be performed in the inkjet method like the forming process of the gate insulating layer 582. As the liquid material, discharged from the discharging head 20, to form the first interlayer insulating layer 583, like the gate insulating layer 582, the material such as SiO2 dispersed in the appropriate solvent to form into the paste, and the sol containing the insulating material can be used. The solution containing the insulating material may be the silane compound, such as the tetraethoxisilane dissolved in the appropriate solvent, such as ethanol, the composition containing the chelate salt of aluminum, organic alkaline metal salt, or organic alkaline-earth metal salt, the composition being prepared such that it comprises only inorganic oxides after baking. The first interlayer insulating layer 583 formed in the inkjet method is then preparatorily dried.

In forming the first interlayer insulating layer 583 in the inkjet method, before performing the discharging operation to form the first interlayer insulating layer 583, a surface treatment to control affinity of the liquid material for the top of the gate insulating layer 582 may be performed. In this case, the surface treatment is the lyophilic treatment, such as the UV treatment or plasma treatment. In this way, the liquid material to form the first interlayer insulating layer 583 is closely adhered to the gate insulating layer 582, and planarized.

By patterning the first interlayer insulating layer 583 and gate insulating layer 582 using the photolithography method, a contact hole is formed corresponding to the source and drain electrodes. Then, a conductive layer made of a metal, such as aluminum, chromium, or tantalum is formed such that the layer covers the first interlayer insulating layer 583, and then a patterning mask is provided such that it covers the region where the source and drain electrodes are to be formed within the conductive layer, and the conductive layer is patterned, thereby the source electrode 543 and drain electrode 544 are formed.

Next, though not shown, the signal lines, common power lines, and scan lines are formed on the first interlayer insulating layer 583. At that time, since the part surrounded by these lines is a pixel forming the luminescence layer as described later, for example, in case when a back emission type is made, each wiring is formed such that the TFT 324 does not locate immediately below the part surrounded by each wiring described above.

Then, as shown in FIG. 10(a), the second interlayer insulating layer 584 is formed such that it covers the first interlayer insulating layer 583, respective electrodes 543, 544, and each not-shown wiring described above.

The first interlayer insulating layer 583 is formed in the inkjet method. Here, the control unit CONT in the apparatus IJ for fabricating the device, as shown in FIG. 10(a), defines a non-discharged region (non-dropped region) H on the top of the drain electrode (first material layer) 544, and discharges the liquid material to form the second interlayer insulating layer 584 such that the material covers the area except for the non-discharged region H in the drain electrode 544, source electrode 543, and first interlayer insulating layer 583, and forms the second interlayer insulating layer 584. In this way, the contact hole 323*a* is formed. Alternatively, the contact hole 323*a* may be formed in the photolithography method.

As the liquid material discharged from the discharging head 20 to form the second interlayer insulating layer 584, like the first interlayer insulating layer 583, the material, such as $SiO_2$ dispersed in the appropriate solvent to be the paste, and the solution containing the insulating material are listed. The sol containing the insulating material may be the silane compound, such as the tetraethoxisilane dissolved in the appropriate solvent, such as ethanol, the composition containing the chelate salt of aluminum, organic alkaline metal salt, or organic alkaline-earth metal salt, the composition being prepared such that it comprises only inorganic oxides after baking. The second interlayer insulating layer 584 formed in the inkjet method is then preparatorily dried.

In forming the second interlayer insulating layer 584 in the inkjet method, before performing the discharging operation of forming the second interlayer insulating layer 584, a surface treatment to control affinity of the liquid material for the non-discharged region H in the drain electrode 544 may be performed. In this case, the surface treatment is a lyophobic treatment. In this way, the liquid material is not disposed on the non-discharged region H, and the contact hole 323*a* can be formed stably. In addition, the lyophilic treatment is previously performed on the top of the drain electrode 544 except for the non-discharged portion H, top of the source electrode 543, and top of the first interlayer insulating layer 583, thereby the liquid material to form the second interlayer insulating layer 584 is closely adhered to the first interlayer insulating layer 583, source electrode 543, and area in the drain electrode 544 except for the non-discharged portion H, and planarized.

Thus, as the contact hole 323*a* is formed in an area corresponding to the drain electrode 544 in the second interlayer insulating layer 584, the second interlayer insulating layer (second material layer, or insulating material layer) 584 is formed on the top of the drain electrode (first material layer or conductive layer). Then, as shown in FIG. 8B, the conductive material is patterned such that the contact hole 323*a* is filled with the conductive material, such as ITO, or a connection is made to the drain electrode 544 through the contact hole 323*a*, and the pixel electrode (anode) 323 is formed.

The anode 323 connected to the organic EL device, including a transparent electrode material, such as ITO, fluorine-doped $SnO_2$, in addition, ZnO and polyamine, is connected to the drain electrode 544 of the TFT 324 through the contact hole 323*a*. To form the anode 323, a film comprising the transparent electrode material is formed on the top of the second insulating layer 584, and then the film is patterned.

Figure 10:
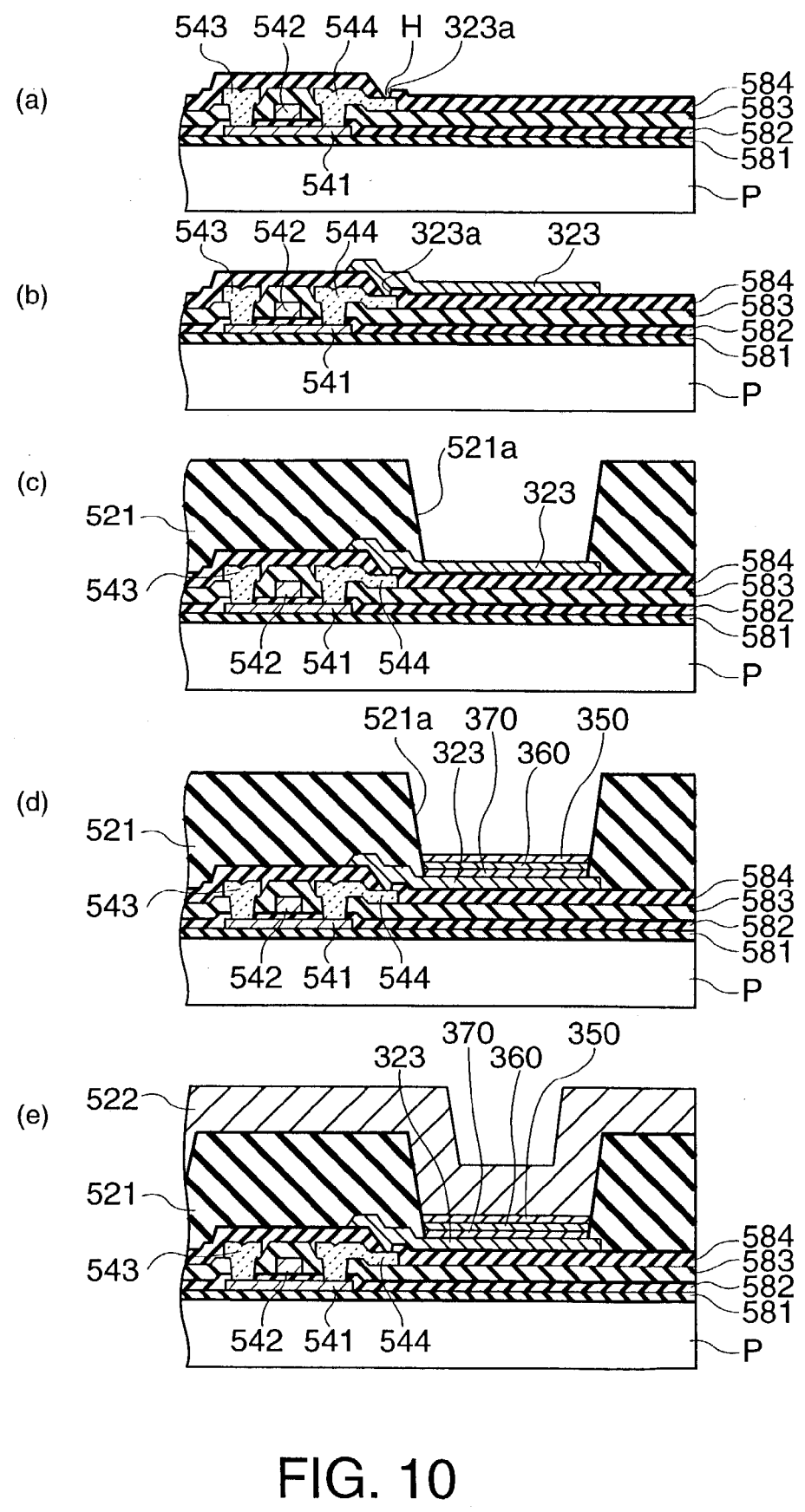

After formation of the anode 523, as shown in FIG. 10(*c*), the organic bank layer 521 is formed such that the layer covers a predetermined portion of the second interlayer insulating layer 584 and a portion of the anode 323. The third insulating layer 521 includes a synthetic resin, such as the acrylic resin, or a polyimide resin. Specifically, as a method of forming the third insulating layer 521, for example, the insulating layer is formed by coating a resist including the acrylic resin, or polyimide resin dissolved in a solvent in a spin coating or dipping coating. Any material can be used as a material to form the insulating layer, when the material has a property not to dissolve in the solvent for the liquid material as described later, moreover can be easily patterned by etching. In addition, the insulating layer is etched in the photolithography technique at the same time, and the opening 521*a* is formed, thereby the third insulating layer 521 having the opening 521*a* is formed.

On the surface of the third insulating layer 521, a region showing the lyophilic property and a region showing the lyophobic property are formed respectively. It is assumed in this exemplary embodiment that each region is formed in a plasma treatment process. Specifically, the plasma treatment process has a preparatory heating process, a lyophilic treatment process of making the wall surface of the opening 521*a* and the electrode surface of the pixel electrode 323 lyophilic, a lyophobic treatment process for making the top of the third insulating layer 521 lyophobic, and a cooling process.

That is, a base (the substrate P including the third insulating layer) is heated to a predetermined temperature (for example, about 70 to 80° C.), then a plasma treatment (O2 plasma treatment) is performed using oxygen as a reactive gas in the atmosphere as the lyophilic treatment process. Subsequently, a plasma treatment (CF4 plasma treatment) is performed using methane tetrafluoride as a reactive gas in the atmosphere as the lyophobic treatment process, then the substrate heated for the plasma treatment is cooled to the room temperature, thereby the lyophilic and lyophobic properties are imparted to predetermined areas. Although the electrode surface of the pixel electrode 323 is also affected by the CF4 plasma treatment in some extent, since the ITO as the material of the pixel electrode 323 has a poor affinity for fluorine, the hydroxyl group imparted in the lyophilic treatment process is not substituted with fluoric group, and thus the lyophilic property is maintained.

Then, as shown in FIG. 10(*d*), the hole transport layer 370 is formed on the top of the anode 323. As a material to form the hole transport layer 370, not particularly limited, any known, related art or later developed material is usable, the material including, for example, triphenylamine derivatives (TPD), pyrazoline derivatives, arylamine derivatives, stilbene derivatives, triphenyldiamine derivatives. Specifically, materials described in JP-A-63-70257, JP-A-63-175860, JP-A-2-135359, JP-A-2-135361, JP-A-2-209988, JP-A-3-37992, and JP-A-3-152184 are exemplified, and the triphenyldiamine derivatives, particularly 4,4'-bis(N(3-methylphenyl)-N-phenylamine)biphenyl, are preferable.

A hole injection layer may be formed instead of the hole transport layer. Also both the hole injection layer and the hole transport layer may be formed. In this case, as the material for forming the hole injection layer, copper phthalocyanine (CuPc), polyphenylenevinylene that is polytetrahydrothiophenylphenylene, 1,1-bis-(4-N,N-ditolylaminophenyl)cyclohexane, tris(8-hydroxiquinolinoleic) aluminum are listed, particularly, use of the copper phthalocyanne (CuPc) is preferable.

In forming the hole injection/transport layer 370, the inkjet method is used. That is, composite liquid materials containing the material for the hole injection/transport layer are discharged on the electrode surface of the anode 323, then the preparatory drying is performed, thereby the hole injection/transport layer 370 is formed on the anode 323. After the process of forming the hole injection/transport layer, in order to reduce or prevent oxidization of the hole injection/transport layer 370 and luminescence layer (organic EL layer) 360, the process is preferably performed in an inert gas atmosphere, such as nitrogen atmosphere or argon atmosphere. For example, the discharge head (not shown) is filled with the composite liquid materials containing the material for the hole injection/transport layer, the discharge nozzle of the discharge head was made opposed to the electrode of the anode 323, and ink droplets where its fluid volume per one droplet is controlled is discharged from the discharge nozzle to the electrode surface with the discharge head being moved relatively with the base (substrate P). Then, the discharged droplets are subjected to the drying treatment so that a polar solvent contained in the composite liquid materials is vaporized, thereby the hole injection/transport layer 370 is formed.

As the composite liquid materials, for example, a mixture of polythiophene derivatives, such as polyethylenedioxithiophene and polystyrenesulfonate dissolved in the polar solvent, such as isopropyl alcohol can be used. Here, the discharged droplet extends over the electrode surface of the anode 323 to which the lyophilic treatment was performed, and filled up in the vicinity of the bottom of the opening 521a. On the other hand, the droplet is repelled and not adhered to the top of the third insulating layer 521 to which the lyophobic treatment was performed. Therefore, it is assumed that, even if the droplet is discharged on the top of the third insulating layer 521 out of the predetermined discharging position, the top is not wetted by the droplet, and the repelled droplet rolls into the opening 521a of the third insulating layer 521.

Then, the luminescence layer 360 is formed on the top of the hole injection/transport layer 370. As a material to form the luminescence layer 360, not particularly limited, a light-emitting material including a low-molecular, organic light-emitting dye and a polymer light-emitting material, or various kind of phosphorescent and fluorescent materials is usable. Among conjugative polymers as the light-emitting material, a polymer containing an allylenevinylene structure is particularly preferable. As the low-molecular, phosphorescent material, for example, dyes such as naphtalene derivatives, anthracene derivatives, perylene derivatives, polymethine series, xanthene series, coumarin series, and cyanin series, 8-hydroquinoline and metal complexes of its derivatives, aromatic amines, tetraphenylcyclopentadiene derivatives, or known materials described in JP-A-57-51781 and JP-A-59-194393 are usable.

The luminescence layer 360 is formed in the same procedure as in the method of forming the hole injection/transport layer 370. That is, the composite liquid materials containing the material for the luminescence layer is discharged on the top of the hole injection/transport layer 370 in the inkjet method, then the preparatory drying treatment is carried out, thereby the luminescence layer 360 is formed on the hole injection/transport layer 370 within the opening 521a formed in the third insulating layer 521. The process of forming the luminescence layer is performed in the inert gas atmosphere as above. Since the discharged composite liquid materials are repelled in a region to which the lyophobic treatment was performed, even if the droplet is out of the predetermined discharging position, the repelled droplet rolls into the opening 521a of the third insulating layer 521.

Then, the electron transport layer 350 is formed on the top of the luminescence layer 360. The electron transport layer 350 is formed in the inkjet method as in the method of forming the luminescence layer 360. A material to form the electron transport layer 350 is not particularly limited, oxadiazole derivatives, anthraquinonedimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, 8-hydroxyquinoline and metal complexes of its derivatives, can be used, for example. Specifically, like the previous material for forming the hole transport layer, materials described in JP-A-63-70257, JP-A-63-175860, JP-A-2-135359, JP-A-2-135361, J-PA-2-209988, JP-A-3-37992, JP-A-3-152184 are exemplified, particularly, 2-(4-biphenylil)-5-(4-t-butylpheny)-1,3,4-oxadiasol benzoquinone, anthraquinone, and tris(8-quinolinoleic)aluminum are assumed to be preferable. After the composite liquid materials are discharged in the inkjet method, the preparatory drying treatment is performed.

The material to form the hole injection/transport layer 370 or the material to form the electron transport layer 350 may be mixed with the material for the luminescence layer 360, and then used as the material for forming the luminescence layer, In this case, the amount used of the material to form the hole injection/transport layer 370 or the material to form the electron transport layer 350 is, though the amount is different depending on the type of the used compound, is properly determined within a range of the amount without significantly disturbing deposition characteristics and light-emission characteristics with regard to them. Typically, the amount is 1 to 40% by weight to that of the material to form the luminescence layer, and preferably 2 to 30% by weight.

Next, as shown in FIG. 10(e), the cathode 522 is formed on the tops of the electron transport layer 350 and the third insulating layer 521. The cathode 522 is formed on the entire surface of the electron transport layer 350 and the third insulating layer 521, or formed in a striped shape. The cathode 522 may be naturally formed in one layer including a simple material, such as Al, Mg, Li, Ca, or an alloy of Mg and Ag (10/1 alloy), however, the cathode may be formed as metal (including alloy) layers including two or three layers. Specifically, a stacked structure including Li2O (about 0.5 nm)/Al, LiF (about 0.5 nm)/Al, or Mg F2/Al may be used. The cathode 222 is a thin film including the above metal, and translucent.

In the exemplary embodiment, although the inkjet method is used in forming respective insulating layers, the inkjet method can be also used in forming the source electrode 543 and drain electrode 544, or the anode 323 and cathode 522. The preparatory drying treatment is performed after each of the composite liquid materials is discharged.

As the conductive material (material to form the device) for forming the conductive material layer, a predetermined metal, or a conductive polymer can be used.

As the metal, at least one metal or metal alloy of silver, gold, nickel, indium, tin, lead, zinc, titanium, copper, chromium, tantalum, tungsten, palladium, platinum, iron, cobalt, boron, silicon, aluminum, magnesium, scandium, rhodium, iridium, vanadium, ruthenium, osmium, niobium, bismuth, and barium can be used. Silver oxide (AgO or Ag2O) or copper oxide can also be used.

In addition, as an organic solvent in making the conductive material into a paste such that the material can be discharged from the discharge head, a solvent containing at least one of alcohol having a carbon number of 5 or more (for example, terpineol, citronellol, geraniol, nerol, and phenethyl alcohol), or a solvent containing at least one of organic esters (for example, ethyl acetate, methyl oleate, butyl ascetate, and glyceride) is available, and can be selected properly depending on application of the metal used or metal paste. Also, mineral spirit, tridecane, dodecylbenzen, or a mixture of them, or a mixture of them with α-terpineol, hydrocarbons having a carbon number of 5 or more (for example, pinene), alcohol (for example, n-heptanol), ethers (for example, ethylbenzilethel), esters (for example, n-butylstearate), ketones (for example, diisobutylketone), organic nitrogen compounds (for example, triisopropanolamine), organic silicon compounds (silicone oil), or organic sulfur compounds or a mixture of them can be used. An appropriate organic material may be added to the organic solvent as required. Depending on the solvent, the gas temperature during the preparatory drying treatment is set up.

Examples of the electronic equipment having the organic EL display apparatus of the exemplary embodiment are described.

Figure 11:
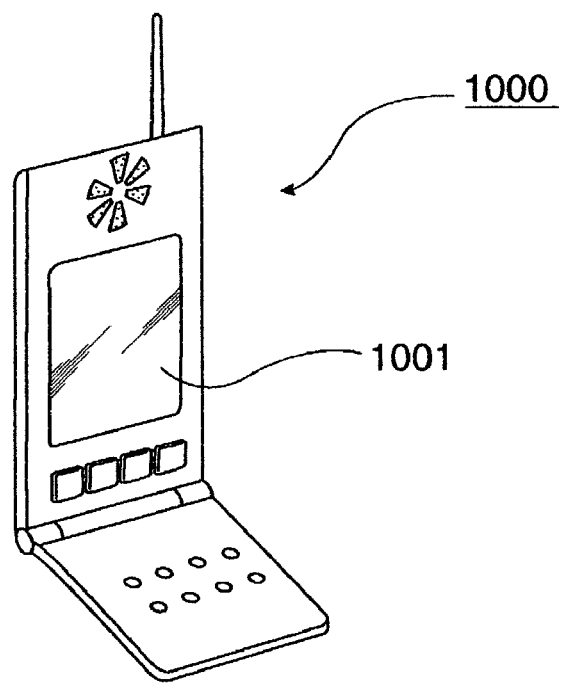
FIG. 11 is a perspective view showing an example of an electronic equipment having the device of the invention.

FIG. 11 is a perspective view showing an example of a cellular phone. In FIG. 11, reference numeral 1000 shows a body of the cellular phone, and reference numeral 1001 shows a display portion using the organic EL display apparatus.

Figure 12:
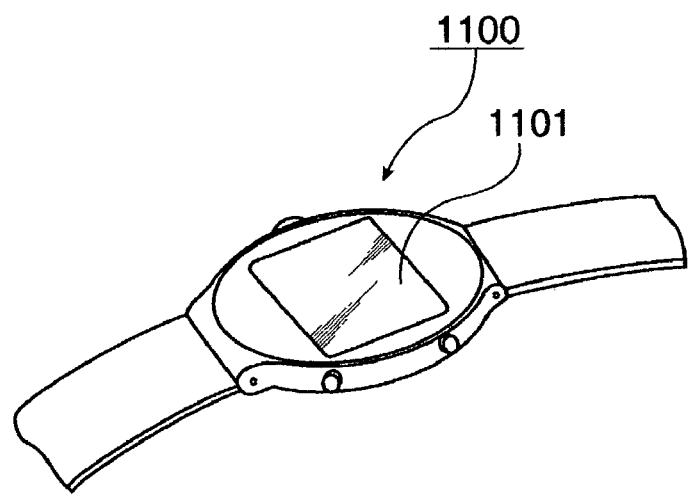
FIG. 12 is a perspective view showing an example of an electronic equipment having the device according to the invention.

FIG. 12 is a perspective view showing an example of watch-type electronic equipment. In FIG. 12, reference numeral 1100 shows a body of the watch, and reference numeral 1101 shows a display portion using the organic EL display apparatus.

Figure 13:
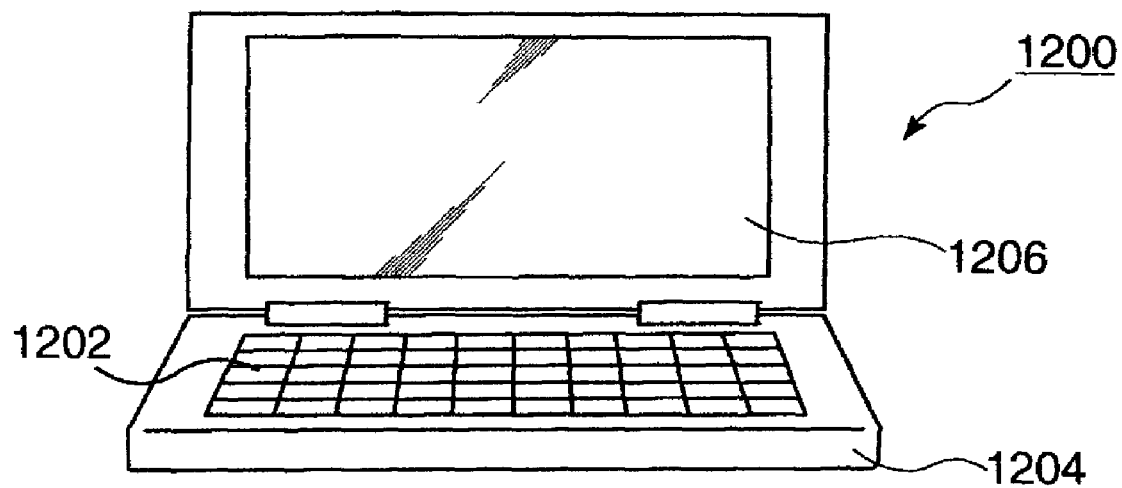
FIG. 13 is a perspective view showing an example of an electronic equipment having the device according to the invention.

FIG. 13 is a perspective view showing an example of portable data processing equipment, such as a word-processor, or personal computer, for example. In FIG. 13, reference numeral 1200 shows the data processing equipment, reference numeral 1202 shows an input, such as a keyboard, reference numeral 1204 shows a body of the data processing equipment, and reference numeral 1206 shows a display portion using the organic EL display apparatus.

The electronic equipment shown in FIG. 11 to FIG. 13 incorporates the organic EL display apparatus of the exemplary embodiment. Therefore an electronic equipment having an organic EL display, which has an excellent display quality and a bright screen, can be realized.

Although, the exemplary embodiment uses the method for fabricating the device of the invention to form a wiring pattern of a driver TFT for the organic EL display device, the method is not to limited to the organic EL display device, and is useable for fabrication of various multilayer-interconnection devices, such as fabrication of a wiring pattern of PDP (plasma display pannel) device, and fabrication of a wiring pattern of liquid crystal display device. In the fabrication of the various multilayer-interconnection devices, the inkjet method can be used in forming either material layer of the conductive material layer and the insulating material layer.

The technical scope of the invention is not limited to the exemplary embodiments, and various changes may be made without departing from the scope of the invention. The specific material and layer structure provided in the exemplary embodiments are only examples, and can be appropriately altered.

As described above, in a preparatory drying treatment of a liquid material disposed on a substrate, the preparatory drying is performed by blowing a gas heated at a predetermined temperature to the substrate on which the liquid material was disposed. Therefore, in the preparatory drying treatment, the preparatory drying can be easily performed, even if the substrate is not removed from a stage of a unit to dispose the liquid material. Therefore, operation efficiency can be enhanced, and cost reduction is achieved.

What is claimed is:

1. An apparatus for fabricating a device, comprising:
   at least a first guide rail and a second guide rail, the second guide rail extending along a first axis, the first guide rail and the second guide rail being perpendicular;
   a movable stage being rotatable to rotate and support a substrate, the movable stage being positioned above and movable along the first guide rail;
   a deposition unit capable of supplying liquid material on the substrate, the deposition unit movable along the second guide rail, the deposition unit including an oscillating positioner to oscillate the deposition unit, the oscillating positioner capable of rotating the deposition unit about three axes and moving the deposition unit linearly along at least two of the three axes, which include the first axis; and
   a preparatory dryer to blow gas heated at a predetermined temperature to the substrate, the preparatory dryer including a plurality of nozzles, the preparatory dryer having a longitudinal shape extending along the first axis, the plurality of nozzles being along the longitudinal shape, the preparatory dryer being parallel to the deposition unit, the stage being capable of moving from the deposition unit to the preparatory dryer, and the deposition unit and the preparatory dryer being separately adjustable relative to a top surface of the stage.

2. The apparatus for fabricating the device according to claim 1, the preparatory dryer having the stage to support the substrate, a gas supply portion capable of supplying the gas to the substrate supported by the stage, and a shifter to move the stage relative to the gas supply portion.

3. The apparatus for fabricating the device according to claim 1, the deposition unit including a unit to discharge droplets capable of quantitatively dropping the liquid material.

4. The apparatus for fabricating the device according to claim 1, wherein the preparatory dryer removes solvent from the liquid material.

5. The apparatus for fabricating the device according to claim 1, the apparatus further comprising:
   at least one of a capping unit and a cleaning unit being disposed on a base of the apparatus below the deposition unit at a predetermined position.

6. An apparatus for fabricating a device, comprising:
   at least a first guide rail and a second guide rail, the second guide rail extending along a first axis, the first guide rail and the second guide rail being perpendicular;
   a movable stage being rotatable to rotate and support a substrate, the movable stage being positioned above and movable along the first guide rail;
   a deposition unit capable of supplying liquid material on the substrate, the deposition unit movable along the second guide rail, the deposition unit including an oscillating positioner to oscillate the deposition unit, the oscillating positioner capable of rotating the deposition unit about three axes and moving the deposition unit linearly along at least two of the three axes, which include the first axis; and
   a preparatory dryer to move a gas above a surface of the substrate, the preparatory dryer including a plurality of nozzles, the preparatory dryer having a longitudinal shape along the first axis, the plurality of nozzles being along the longitudinal shape, the preparatory dryer being parallel to the deposition unit, the stage being capable of moving from the deposition unit to the preparatory dryer, and the deposition unit and the preparatory dryer being separately adjustable relative to a top surface of the stage.

7. The apparatus for fabricating the device according to claim 6, wherein the preparatory dryer removes solvent from the liquid material.

8. The apparatus for fabricating the device according to claim 6, the apparatus further comprising:
   at least one of a capping unit and a cleaning unit being disposed on a base of the apparatus below the deposition unit at a predetermined position.

* * * * *